(12) United States Patent
Lill et al.

(10) Patent No.: US 8,709,953 B2
(45) Date of Patent: Apr. 29, 2014

(54) PULSED PLASMA WITH LOW WAFER TEMPERATURE FOR ULTRA THIN LAYER ETCHES

(71) Applicant: Applied Materials, Inc., Santa Clara (US)

(72) Inventors: Thorsten Lill, Santa Clara, CA (US); Klaus Schuegraf, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/654,285

(22) Filed: Oct. 17, 2012

(65) Prior Publication Data

US 2013/0109190 A1    May 2, 2013

Related U.S. Application Data

(60) Provisional application No. 61/552,173, filed on Oct. 27, 2011.

(51) Int. Cl.
*H01L 21/302* (2006.01)
*H01L 21/461* (2006.01)

(52) U.S. Cl.
USPC .............................. 438/715; 216/67

(58) Field of Classification Search
USPC .......................... 216/67; 438/715
See application file for complete search history.

(56) References Cited

U.S. PATENT DOCUMENTS 6,063,710 A * 5/2000 Kadomura et al. ........... 438/715

* cited by examiner

*Primary Examiner* — Roberts Culbert
(74) *Attorney, Agent, or Firm* — Blakely, Sokoloff, Taylor & Zafman LLP

(57) ABSTRACT

Ultrathin material layers are plasma etched with an etch system configured for cryogenic cooling of a substrate to reduce the diffusion coefficients of foreign and intrinsic stop layer atoms (e.g., of the bombarded crystal lattice), and further configured for plasma pulsing to reduce the energy of the impinging ions with cryogenic wafer temperatures. Substrate temperatures of −50° C. or more are employed to reduce the susceptibility of a stop layer material to damage associated with ion impact. Ion energy is reduced to below the threshold where stop layer lattice atoms are displaced or ions are implanted into the bulk lattice. In embodiments, a plasma of an etchant gas having ion energies less than 10 eV are achieved through plasma pulsing, which when directed at the low temperature substrate may controllably etch ultra-thin material layers.

10 Claims, 7 Drawing Sheets

PLASMA ON

PLASMA OFF

PULSED PLASMA WITH LOW WAFER TEMPERATURE FOR ULTRA THIN LAYER ETCHES

CROSS REFERENCE TO RELATED APPLICATIONS

This application claims the benefit of U.S. Provisional Application No. 61/552,173 filed on Oct. 27, 2011 titled "PULSED PLASMA WITH LOW WAFER TEMPERATURE FOR ULTRA THIN LAYER ETCHES," the content of which is hereby incorporated by reference in its entirety for all purposes.

TECHNICAL FIELD

Embodiments of the present invention pertain to the field of microelectronic device processing and, in particular, to plasma etching of thin film material layers.

DESCRIPTION OF RELATED ART

As microelectronic device scaling progresses, the devices are made of ever thinner material layers (i.e., thin films). In extreme cases, these thin film layers may be only one atomic layer in thickness, as in the case of graphene currently being investigated as a microelectronic device layer.

Subtractive processing techniques become more challenging as the material layers become thinner because etching stacks of such thin layers entails etching through a thin layer and stopping on an underlying material layer that may also be only a few atomic layers in thickness. As such, an etch stop layer has to be completely undisturbed after the etch. This is an extremely demanding requirement for a plasma etching technique which is essentially chemically assisted physical sputtering. In plasma etching, ions need to impact the surface for reaction products to be removed from the workpiece surface. This same impact however, can cause physical damage to the underlying stop layer and if the underlying stop layer is ultra-thin (e.g., less than 4 atomic layers in thickness), the microelectronic device may be rendered inoperable by the physical layer damage caused by the plasma etching process.

While additive processing, such as atomic layer deposition and epitaxial growth techniques are capable of forming ultra-thin device films, device fabrication techniques which rely exclusively on additive techniques are less flexible and often cost-prohibitive. Therefore, plasma etching chambers and plasma etching techniques capable of ultra-thin material layer etching are advantageous.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific lithographic patterning and etching techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
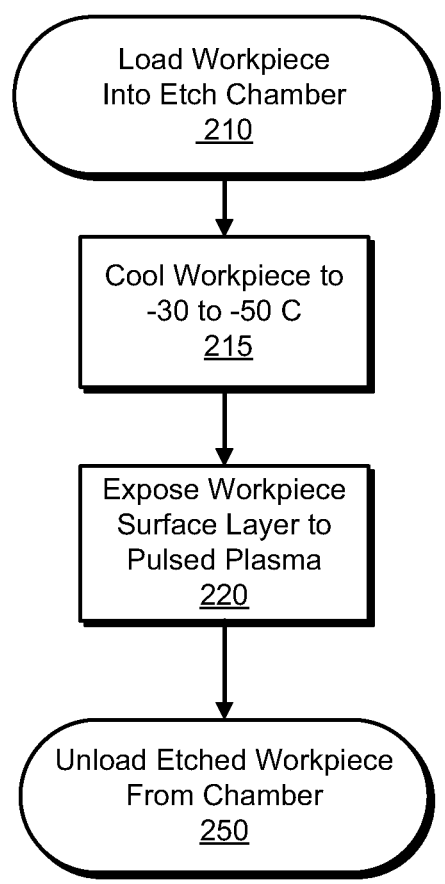
FIG. 1 is a flow diagram illustrating an ultra-thin layer etch method 200 in accordance with an embodiment of the present invention.

FIG. 1 is a flow diagram illustrating an ultra-thin layer plasma etching method 200 in accordance with an embodiment of the present invention. While the method 200 may find application in many microelectronic fabrication processes, such as, but not limited to, gate dielectric etch, shallow trench isolation (STI) etch, self-aligned spacer etch, contact metallization preclean, etc., in the exemplary embodiment, an ultra-thin layer of graphene is etched and stopped on a crystalline semiconductor substrate or a dielectric material disposed between the substrate and the grapheme layer. In another exemplary embodiment, a material layer is etched and the plasma etching process is stopped on an ultra-thin layer of graphene (e.g., for example a gate dielectric is etched and the etch is stopped on a graphene channel layer as part of a graphene transistor fabrication process).

The method 200 begins with loading a workpiece into an etch chamber at operation 210. For the exemplary embodiment illustrated in FIG. 1, the workpiece includes a substrate with a masked stack disposed over the substrate. The masked stack includes at least a graphene layer to be etched or to be stopped on, and a masking pattern may be a lithographically defined material or a hard mask previously etched that defines a gate stack over the graphene layer, the gate stack including a gate dielectric material having a wider bandgap than the graphene stop layer.

As graphene device layers and gate dielectric layers, typically including silicon dioxide, and/or a high-K dielectric (e.g., a silicate of hafnium or the like), are already scaled to thicknesses that are commonly referred to as material monolayers, the exemplary embodiment illustrates the general type of plasma etching process that is to be performed by the method 200. As such, the method 200 is to be distinguished from deep cryogenic plasma etches where extreme anisotropy and high aspect ratio (HAR) feature generation (deep vias, etc.) are the design criteria for etch processes and for the etch systems that perform such etches. As the films etched with the techniques described herein are ultra-thin, aspect ratio is on the order of 1:1 and therefore ion shadowing, microloading, etch stop, sidewall passivation and other HAR-related issues are not important. More important to the plasma etching of ultra-thin material layers is a balance between ion energy and stop layer (substrate) temperature to achieve a nominal etch rate of an ultra-thin target film with minimal etch damage to an underlying etch stop layer, which is also an ultra-thin film in certain embodiments. As such, the method 200 is to achieve an extremely high etch selectivity between a target ultra-thin film layer and a stop layer not through high etch rate of the target material, but instead through minimal etch rate (or sputtering damage) of the stop layer.

At operation 215, the workpiece is cooled to at least −20° C. and preferably between −30° C. and −50° C. In such embodiments, cryogenic cooling of the workpiece is employed to reduce the susceptibility of the stop layer material to damage associated with ion impact. Generally, in a plasma etch process, the energy of the impinging ion has to be high enough to break the bond between the reaction product molecule and the stop layer material lattice. However, the ion energy should not exceed the threshold where lattice atoms are displaced and/or ions are implanted into the bulk lattice. To an extent, ion energy can be lowered as the RF power at the cathode (i.e., bias power) of the etch reactor is reduced. However, at zero power on the reactor cathode, the ion energy equals the so-called "self-bias" of the plasma, or plasma potential, multiplied by the charge of the etchant ion. This self-bias is in the range of 10 to 20 eV and is the lower limit in conventional plasma etch reactors.

In embodiments of the present invention, at operation 220, the workpiece is exposed to a plasma (e.g., of an etchant gas or gases) having ion energies are less than 10 eV and in the preferred embodiment to between 2-4 eV. This lower ion energy acts to reduce or prevent lattice damage. These lower ion energies are achieved at operation 220 by performing one or more forms of plasma pulsing. As such, embodiments of the present invention utilize plasma pulsing to reduce the energy of the impinging ions with cryogenic wafer temperatures to reduce the diffusion coefficients of foreign and intrinsic stop layer atoms (e.g., of the bombarded crystal lattice.)

In the exemplary embodiment, method 200 is applied to etch ultra-thin films having thicknesses corresponding to less than 4 atomic layers, with particular embodiments being in the range of 2-20 nm. Depending on the embodiment, the ultra-thin film etch rates vary, but are generally quite low, being considerably less than 100 nm/min and often in the range of 10-30 nm/min. With these low etch rates, sputtering damage is of considerable importance and is addressed through the ultra-low ion energy and ultra-low stop layer temperatures describe herein.

Method 200 completes with an etched workpiece being unloaded from the etch chamber at operation 250. It is noted that a plurality of etch steps may be performed successively in an etch chamber, such that the operations 215 and 220 may be repeated with a successive plasma etches performed at different processes conditions (e.g., different temperatures, different pulsing parameters, different plasma powers or different etchant gases).

Figure 2:
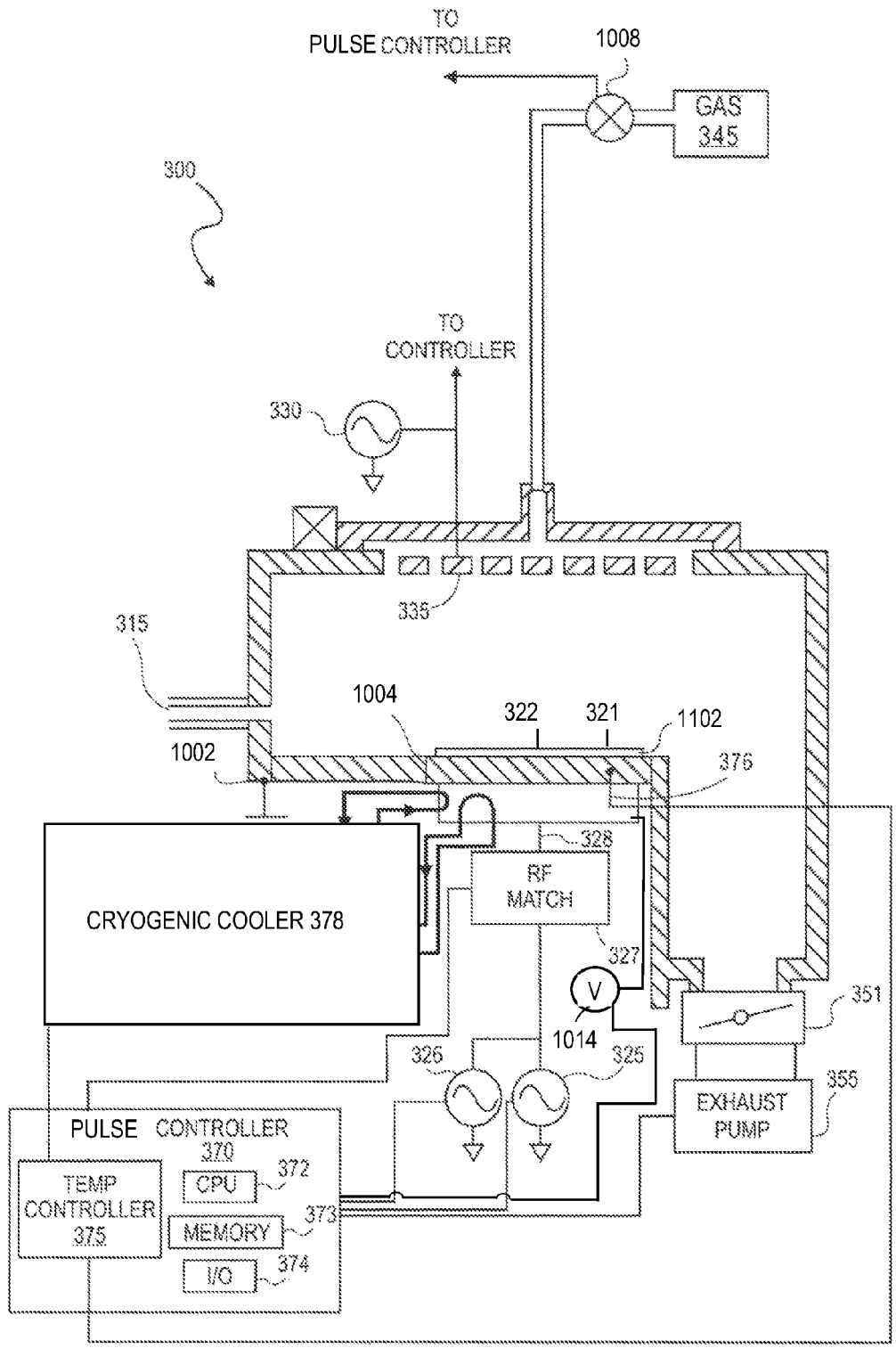
FIG. 2 illustrates a cross-sectional schematic view of a plasma etch system 300 which plasma pulsing and cryogenic temperature control capabilities to perform the etch method illustrated in FIG. 1, in accordance with an embodiment.

FIG. 2 illustrates a cross-sectional schematic view of a plasma etch system 300 with plasma pulsing and cryogenic temperature control capabilities to perform the etch method 200, in accordance with an embodiment. The plasma etch system 300 may be any type of high performance etch chamber known in the art, such as, but not limited to, any plasma etch system manufactured by Applied Materials of CA, USA (e.g., Enabler™, MxP®, MxP+™, Super-E™, DPS II AdvantEdge™ G3, or E-MAX®). Other commercially available plasma etch systems may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature controlled component.

The plasma etch system 300 includes a chamber 1002. A substrate (workpiece) 1102 is loaded through an opening 315 and clamped to a temperature controlled electrostatic chuck 1004. In particular embodiments, temperature controlled chuck 1004 includes a plurality of zones, each zone independently controllable to a temperature setpoint which may be the same or different between the zones. In the exemplary embodiment, an inner thermal zone 322 is proximate a center of substrate 1102 and an outer thermal zone 321 is proximate to a periphery/edge of substrate 1102 with each of the zones monitored by one or more temperature probe 376. For the system 300, the chuck 1004 is thermally coupled to a cryogenic cooler 378, which is further coupled directly or indirectly to a temperature controller 375. The temperature controller 375 may acquire the temperature setpoint for the chuck 1004 and control operation of the cryogenic cooler 378. Feedforward or feedback control lines may be implemented by the temperature controller 375 to maintain a workpiece disposed on the chuck 1004 at a precise temperature over time during a plasma etch of an ultra-thin layer, (e.g., at operation 220 in FIG. 1). In one embodiment, the plasma power (e.g., total bias power) is utilized as the basis for a feedforward chuck temperature control loop determining a cooling power applied to the chuck 1004.

In the exemplary embodiment, two coolant loops are employed: one coolant loop for the inner chuck zone 322 and a second coolant loop for an outer chuck zone 321. Because the ultra-thin layer etch method 200 is a balance between freezing the substrate to reduce or prevent damage (e.g., lattice damage for a crystalline substrate layer) of a stop layer disposed below the ultra-thin film being plasma etched, and providing sufficient ion energy to etch the targeted ultra-thin film, uniformity of this balance across a diameter of a substrate is more important than for more forgiving etch process (e.g., of thicker films, high temperatures, and/or RF powers). As such, more than the two independent temperature control zones depicted in FIG. 1 may be utilized in embodiments.

The cryogenic cooler 378 is to maintain the chuck 1004 at a temperature sufficient to maintain the workpiece during an etch process below −20° C., and advantageously between −30° C. and −50° C., or possibly even below −50° C. For example, in certain embodiments the chuck 1004 is maintained at a temperature between −30° C. and −75° C. throughout execution of the method 200. Depending on the amount of RF power applied to the workpiece during the plasma etch operation 220, the cryogenic cooler 378 is to provide 15 kW cooling power, or more. In particular embodiments, the cryogenic cooler 378 is replicated to have a dedicated cooler for each of the inner and outer zones of the chuck 1004. In an embodiment, the cryogenic cooler 378 is a Joule-Thomson cooler with each coolant loop to transport liquid nitrogen ($LN_2$) proximate to the chuck 1004 for expansion. In other embodiments, an alternate cryogenic cooling loop is employed, for example including a technology other than a Joule-Thomson cooler.

When plasma power is applied to the chamber 1002, a plasma is formed in a processing region over substrate 1102. In the exemplary embodiment, a first plasma bias power 325 is coupled to the chuck 1004 (e.g., cathode) via power input 328 to energize the plasma. The plasma bias power 325 typically has a low frequency of about 2 MHz, 13.56 MHz, or 60 MHz. In the exemplary embodiment, the plasma etch system 300 includes a second plasma bias power 326 operating at a different low frequency that the bias power 325, for example operating at the 2 MHz band. The bias powers 325, 326 are connected to the same RF match 327 to provide a dual frequency bias power to the cathode.

A plasma source power 330 is coupled through a second match (not depicted) to a plasma generating element 335 (e.g., showerhead) which may be anodic relative to the chuck 1004 to provide high frequency source power to energize the plasma. The plasma source power 330 typically has a higher frequency than the plasma bias power 325, such as between 100 and 180 MHz, and in a particular embodiment, is in the 162 MHz band. In alternate embodiments, the source power 330 may couple energy into the plasma inductively (e.g., ICP) and for such embodiments the source power 330 operates at between 2 and 27 MHz (e.g., 13.56 MHz). For either implementation, bias power more directly affects the bias voltage on substrate 1102, controlling ion bombardment of the substrate 1102, while source power more directly affects the plasma density.

Figure 3:
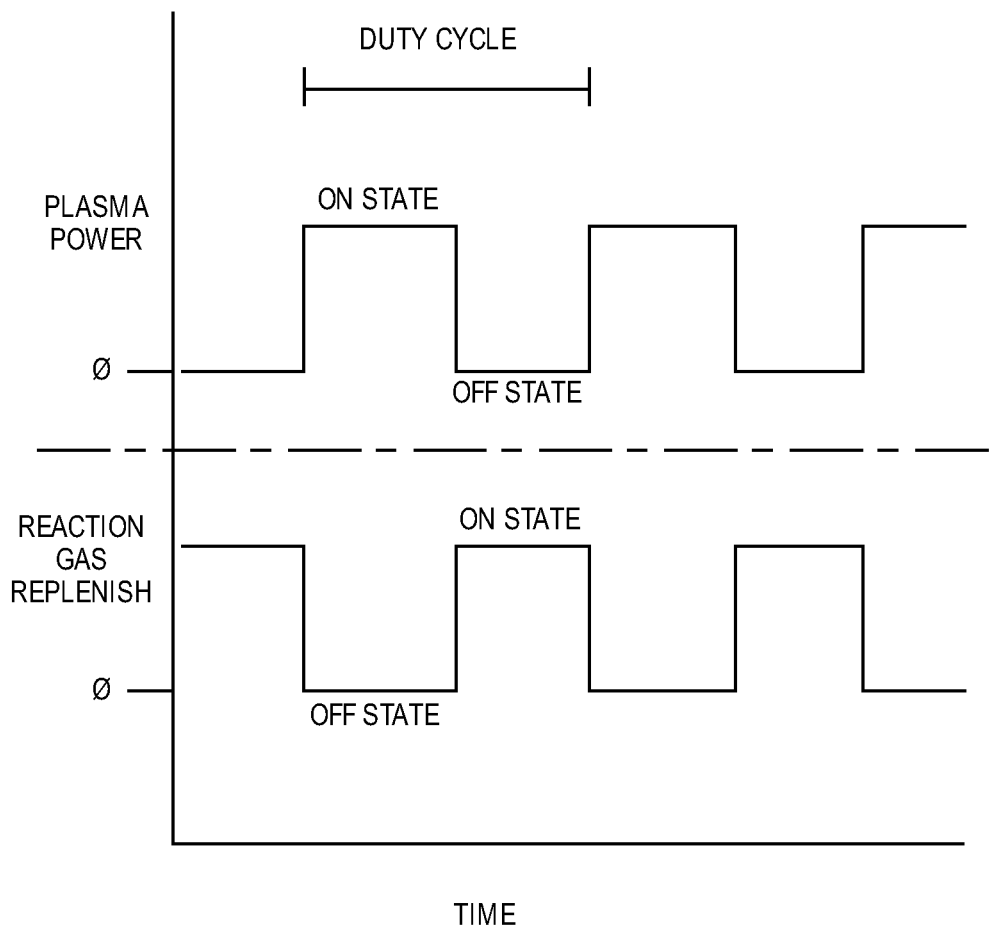
FIG. 3 illustrates the timeline of a duty cycle, as represented in a waveform, in accordance with an embodiment.

In the exemplary embodiment, the plasma etch system includes a plasma pulse controller 370. FIG. 3 illustrates the timeline of a duty cycle, as represented in a waveform, where a plasma power is cycled over a duty cycle while a reaction gas replenish is pulsed with an equal duty cycle but out of phase with that of the plasma power. The plasma pulse controller 370 is to control the duty cycle of at least the plasma power of at least one of the bias powers 325, 326 and source power 330. In further embodiments, the plasma pulse controller 370 is further to control the duty cycle of gases supplied to the etch chamber 1002. As shown, for the exemplary embodiment the pulse controller 370 includes a CPU 372, memory 373 and I/O 374, all of which may be in the form of a personal computing platform configured to execute a control algorithm.

Generally, either a single RF energy source may be pulsed or a plurality of RF sources may be pulsed synchronously during the plasma etch operation 220. In single RF source pulsing, either the source power 330 or one of the bias powers 325, 326 may be pulsed with the remaining RF sources either operated at a duty cycle of 0% (continuously off) or 100% (continuous wave). In synchronous pulsing embodiments, two or more RF sources are pulsed with duty cycles being equal and in-phase or unequal and/or out of phase with each other (e.g., equal and 180 degree phase difference illustrated by FIG. 3). The plasma pulse frequency is between 1 Hz and 200 kHz and preferably over 10 kHz with the duty cycle being anywhere between 20% and 90% and preferably between 65% and 75%. In the exemplary graphene etch process, only source power 330 is applied and after an initial strike sequence, the source power 330 is pulsed at a duty cycle of between 65% and 70% for the duration of the operation 220 while the bias powers 325 and 326 remain off.

Figure 4A:
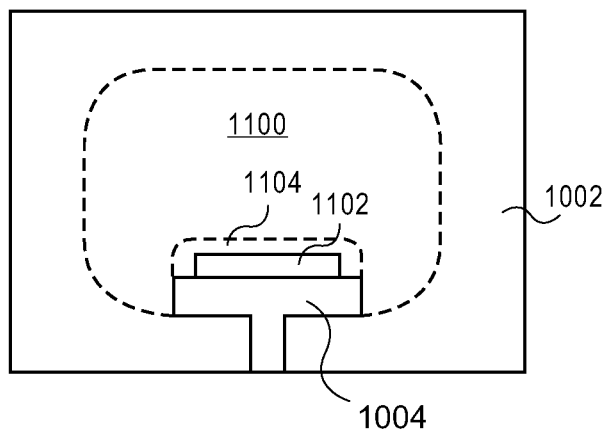
FIGS. 4A-B illustrate the chamber from the etch system 300 in a plasma ON state and a plasma OFF state, respectively, in accordance with an embodiment of the present invention.
Figure 4B:
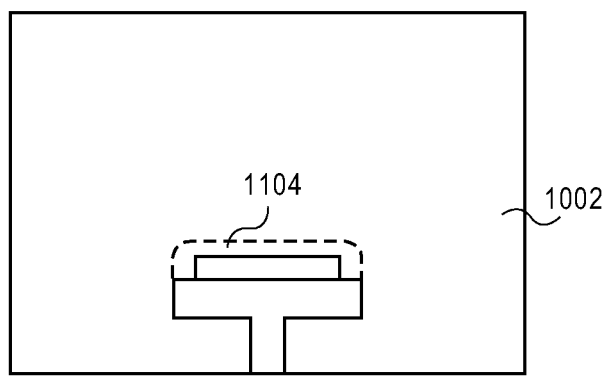

FIGS. 4A-B illustrate the chamber from the etch system 300 in a plasma ON state and a plasma OFF state, respectively, in accordance with an embodiment of the present invention. Referring to FIG. 4A, a reaction region 1104 is formed in proximity to a workpiece disposed on the chuck 1004 during an ON state when the plasma 1100 is present. During the pulsed etch operation 220, etch by-products may be formed and reside, at least for a time, within reaction region 1104. Thus, in accordance with an embodiment of the present invention, the set of instructions for pulse controller 370 includes timing instructions such that the ON state is of a sufficiently short duration to substantially impart ion energies at a first nominal level (e.g., 20 eV) within reaction region 1104. Referring to FIG. 4B, chamber 1002 is in a plasma OFF state (i.e. a neutral reaction gas). In accordance with an embodiment of the present invention, the set of instructions for the pulse controller 370 includes timing instructions such that the OFF state of a duty cycle in the pulsed plasma etch operation 220 is selected to be of a sufficiently long duration to time average down the ion energies to a second level (e.g., 2-4 eV). Because neutral collisions increase during the OFF state, ion energy imparted by the self-bias of the etch system 300 during the ON state can be reduced such that few if any ions having energies above 5 eV impinge the substrate 1102.

Because reaction gas species used to generate the plasma may be consumed during the ON state of a duty cycle in a pulsed plasma etch process, plasma self-bias conditions may change over the duration of a plasma pulsing duty cycle. In some instances, the plasma modification may be substantial enough to alter the plasma bias potential unfavorably. This effect may be detrimental on attempts to conduct a low damage etching process for the ultrathin material layers described herein. By replenishing the reaction gas during the etching process, plasma modification may be mitigated. On the other hand, replenishing the reaction gas during the ON state of a plasma in a pulsed plasma etch process may cause a plasma species gradient to form, leading to inconsistent ion energy across workpiece 1102.

Figure 5A:
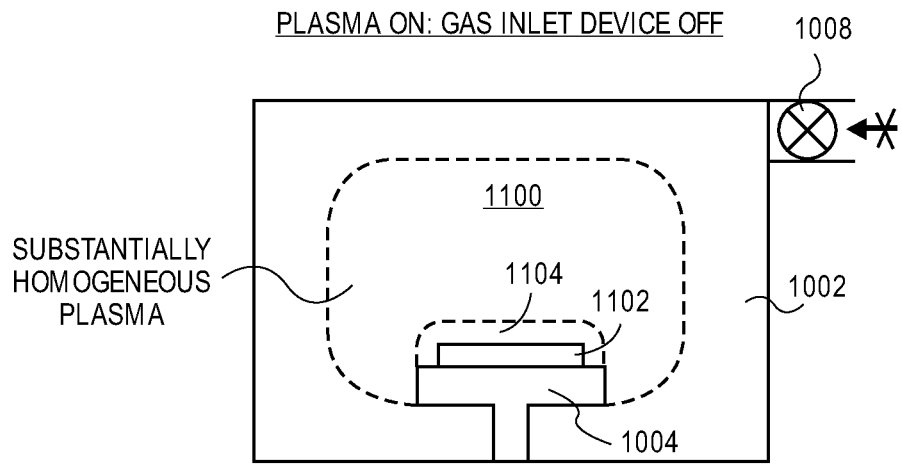
FIGS. 5A-B illustrate the chamber 1002 in a plasma ON/gas inlet device OFF state and a plasma OFF/gas inlet device ON state, respectively, in accordance with an embodiment of the present invention.
Figure 5B:
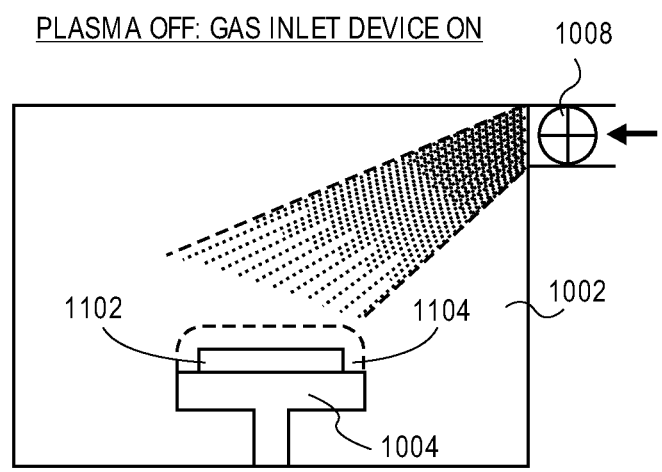

FIGS. 5A-B illustrate the chamber 1002 in a plasma ON/gas inlet device OFF state and a plasma OFF/gas inlet device ON state, respectively, in accordance with an embodiment of the present invention. Referring to FIG. 5A, a substantially homogeneous plasma is achieved during the ON state of the duty cycle by replenishing the reaction gas during the OFF state of the duty cycle only. Referring to FIG. 5B, the reaction gas on which the plasma from FIG. 5A is based is replenished during the OFF state of the plasma. Thus, in accordance with an embodiment of the present invention, a pulsed reaction gas replenish process is conducted in parallel with the pulsed plasma process. That is, the reaction gas replenish is implemented 180° out of phase with the plasma power pulsing, replenishing etchant species during the OFF state, but not during the ON state, of a duty cycle in a pulsed plasma etch process.

In an embodiment, a plasma bias voltage is applied to the substrate during the etch operation 220. Referring back to FIG. 2, a voltage source 1014 is coupled to the chuck 1004 to bias the sample with a negative charge during the etching operation 220 to help keep ion energies in the 2-4 eV range. In an embodiment this biasing is also pulsed along with an RF plasma generating source (e.g., source power 330) to drop the applied bias voltage to zero during the OFF state of a plasma power duty cycle. Thus, in accordance with an embodiment of the present invention, the voltage source 1014 is coupled to the pulse controller 370 to conduct a pulsed sample bias cycle concurrently with a pulsed plasma process having pulsed reaction gas replenish. That is, the sample is negatively biased during the ON state and is zero-biased during the OFF state of a duty cycle in a pulsed plasma etch process having pulsed reaction gas replenish.

Figure 6A:
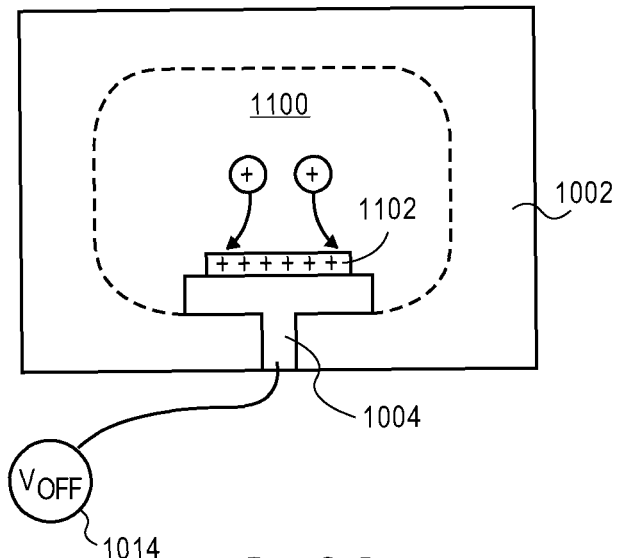
FIGS. 6A-D illustrate an etch system 300 in a plasma ON/bias OFF state, a plasma ON/bias ON state, a plasma OFF/bias ON state and a plasma OFF/bias OFF state, respectively, in accordance with an embodiment of the present invention.
Figure 6B:
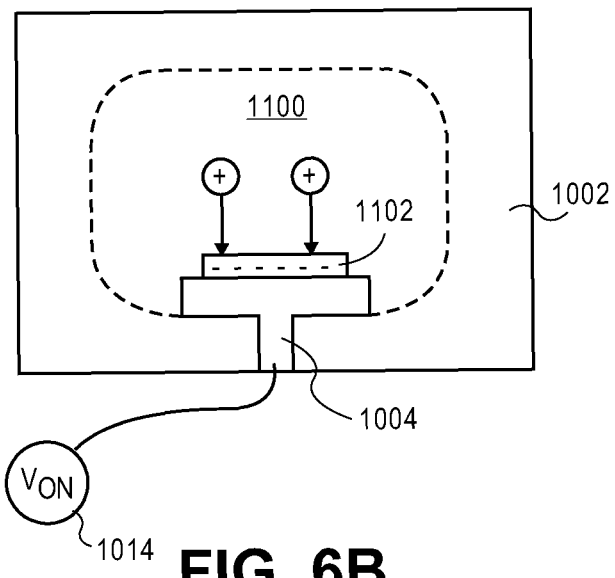

FIGS. 6A-D illustrate an etch system 300 in a plasma ON/bias OFF state, a plasma ON/bias ON state, a plasma OFF/bias ON state and a plasma OFF/bias OFF state, respectively, in accordance with an embodiment of the present invention. The voltage source 1014 is coupled with the chuck 1004 and is used to bias the chuck 1004, and hence the workpiece 1102, during the ON state of a duty cycle. Referring to FIG. 6A, the voltage source 1014 is in an OFF state. Referring to FIG. 6B, voltage source 1014 is in an ON state (i.e. negatively biasing the chuck 1004). In accordance with an embodiment of the present invention, voltage source 1014 is used to apply a negative bias to chuck 1004 in the range of 100-200 Volts during the ON state of a duty cycle.

Figure 6C:
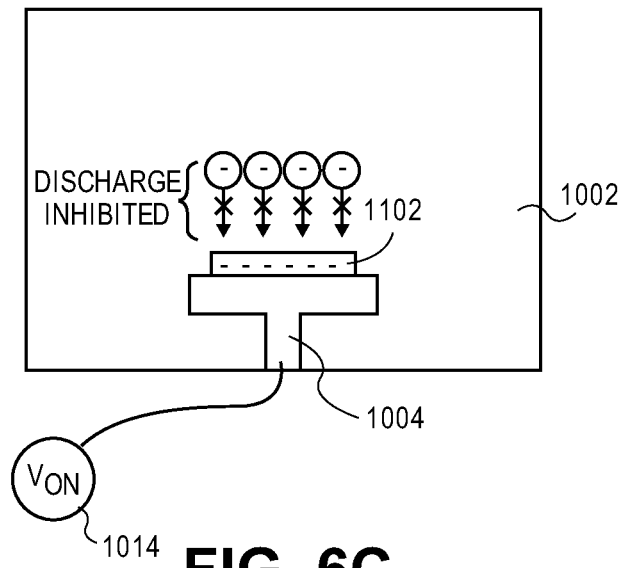
Figure 6D:
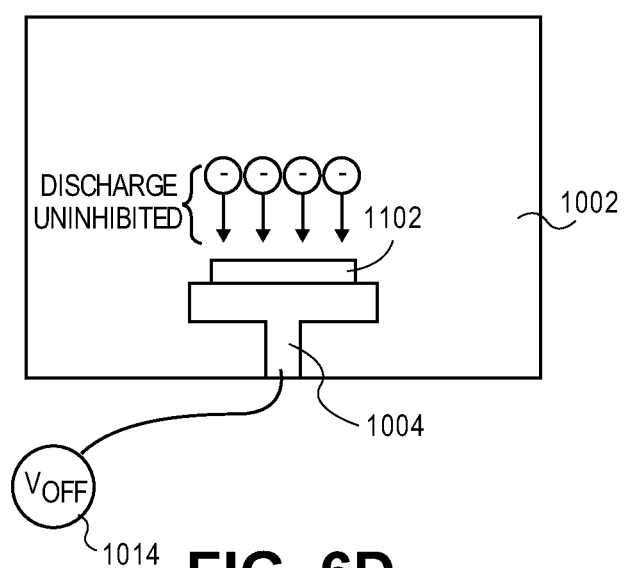

Referring to FIG. 6C, voltage source 1014 is in an ON state. However, referring to FIG. 6D, voltage source 1014 is in an OFF state (i.e. zero-biasing chuck 1004). In accordance with an embodiment of the present invention, voltage source 1014 is turned off to apply a zero bias to chuck 1004 during the OFF state of a duty cycle.

Returning to FIG. 2, in the etch system 300 process gases, are supplied from gas source(s) 345 through a mass flow controller(s) 1008 to the interior of the chamber 1002. Chamber 1002 is evacuated via an exhaust valve 351 connected to a high capacity vacuum pump stack 355 to maintain a plasma process pressure of between 2 mTorr and 50 mTorr during the pulsed plasma etch operation 220.

Generally, for the systems and ultra-thin film etch processes described herein, no polymerizing gas sources are employed during the etch operation 220. For example, in one embodiment, no fluorocarbons are utilized in the gas source(s) 345. In further embodiments, only halogens and hydrogen serve as a chemical species. For example, in a graphene etch embodiment, the gas source(s) 345 consist essentially of one or more of: Cl, HBr, $H_2$ ($H_2$:$N_2$) as a chemical etchant species. In other words, source gases other than these amount to less than 5% of the total volumetric flow of all source gases combined. In further embodiments, the gas source 345 includes an electropositive inert gas in addition to the chemical etchant species. In one such embodiment, Ar is introduced to modify the plasma potential. While it may seem counterintuitive to introduce Ar, as a relatively massive ionizable species, the concomitant reduction in ion energy outweighs the mass consideration. However, other less electropositive inert species may also be utilized, such as Ne and He.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method for plasma etching a workpiece, comprising:
   cooling a substrate to between −20° C. and −50° C.;
   etching a target material layer disposed on a stop layer disposed over the substrate by exposing the target material layer to a plasma of an etchant gas, and wherein the plasma is energized by RF power that is pulsed to reduce the average energy of ionic species impinging on the substrate to below 5 eV.

2. The method of claim 1, wherein the RF power is delivered by only an inductively coupled source and the RF power is pulsed at a frequency of between 1 Hz and 200 kHz and a duty cycle between 20% and 90%.

3. The method of claim 1, further comprising biasing the sample with negative charge during an on phase of a plasma power duty cycle, and applying no bias during an off phase of the plasma power duty cycle.

4. The method of claim 1, wherein cooling the substrate further comprises transporting liquid nitrogen ($LN_2$) to a surface of a chuck upon which the substrate is disposed.

5. The method of claim 1, wherein the material layer is graphene and the material layer thickness etched is between 2 nm and 20 nm.

6. The method of claim 1, wherein the stop layer is graphene and the material layer is a dielectric material having a wider bandgap than the graphene.

7. A method for plasma etching a thin film stack comprising a graphene layer, the method comprising:
   loading a substrate including the thin film stack into a process chamber;
   cooling the substrate to between −20° C. and −50° C.;
   introducing a hydrocarbon-free etchant gas to the process chamber;
   generating a plasma of the etchant gas, wherein the plasma is energized by an RF power that is pulsed to reduce the average energy of ionic species impinging on the substrate to below 5 eV.

8. The method of claim 7, wherein introducing the hydrocarbon-free etchant gas comprises pulsing a flow of HBr or Cl into the chamber.

9. The method of claim 7, wherein generating the plasma of the etchant gas further comprises pulsing an inductively coupled source at a frequency of between 1 Hz and 200 kHz and a duty cycle between 20% and 90%.

10. The method of claim 9, wherein the graphene layer thickness is between 2 nm and 20 nm and wherein the thin film stack further comprises a dielectric material having a wider bandgap than that of the graphene layer.

* * * * *

UNITED STATES PATENT AND TRADEMARK OFFICE
CERTIFICATE OF CORRECTION

PATENT NO. : 8,709,953 B2
APPLICATION NO. : 13/654285
DATED : April 29, 2014
INVENTOR(S) : Lill et al.

Page 1 of 1

It is certified that error appears in the above-identified patent and that said Letters Patent is hereby corrected as shown below:

In the Specification

Column 1, line 59, replace "system 300 which plasma pulsing" with "system 300 with plasma pulsing"

Column 2, line 55, replace "the grapheme layer" with "the graphene layer"

Column 3, line 55, replace "bombarded crystal lattice.)" with "bombarded crystal lattice)."

Column 4, line 3, replace "repeated with a successive plasma etches" with "repeated with successive plasma etches"

Column 5, line 19, replace "different low frequency that the bias power" with "different low frequency than the bias power"

Signed and Sealed this
Twenty-third Day of September, 2014

Michelle K. Lee
*Deputy Director of the United States Patent and Trademark Office*